United States Patent [19]
Denton et al.

[11] Patent Number: 5,511,306
[45] Date of Patent: Apr. 30, 1996

[54] MASKING OF CIRCUIT BOARD VIAS TO REDUCE HEAT-INDUCED BOARD AND CHIP CARRIER PACKAGE WARP DURING WAVESOLDER PROCESS

[75] Inventors: Ronald D. Denton, Spring; George H. Bumgardner, Cypress; Timothy M. McGuiggan, Houston; Andrew J. Mawer, Austin, all of Tex.

[73] Assignee: Compaq Computer Corporation, Houston, Tex.

[21] Appl. No.: 222,899

[22] Filed: Apr. 5, 1994

[51] Int. Cl.$^6$ ........................................ H05K 3/46
[52] U.S. Cl. .................. 29/840; 29/852; 228/180.1
[58] Field of Search ..................... 29/840, 837, 832, 29/841, 852; 228/180.1, 180.22

[56] References Cited

U.S. PATENT DOCUMENTS

| | | | |
|---|---|---|---|
| 4,739,919 | 4/1988 | Van Den Brekel et al. | 228/180.1 |
| 4,761,881 | 8/1988 | Bora et al. | 228/180.1 |
| 4,827,610 | 5/1989 | Williams et al. | 29/840 |
| 5,111,991 | 5/1992 | Clawson et al. | 228/180.1 |
| 5,155,904 | 10/1992 | Majd | 29/840 X |
| 5,270,903 | 12/1993 | McMichen et al. | 29/840 X |

FOREIGN PATENT DOCUMENTS

| | | | |
|---|---|---|---|
| 4-026199 | 1/1992 | Japan | 29/840 |
| 5-037146 | 2/1993 | Japan | 29/840 |

*Primary Examiner*—Peter Vo
*Assistant Examiner*—Khan V. Nguyen
*Attorney, Agent, or Firm*—Pravel, Hewitt, Kimball & Krieger

[57] ABSTRACT

A technique for minimizing heat-induced chipside solder joint fractures involving BGA (Ball Grid Array) components mounted on a multilayer printed circuit board when the board is passed through a wavesolder oven. The technique involves shielding the chipside solder joints from the effects of conductive heating by covering the through vias positioned underneath the BGA components with an insulating material. The insulating materials include silk screen material, solder mask and KAPTON tape. During wavesolder, the insulating material blocks conductive heat flow from the exposed board face through the vias and into the BGA component landing areas. With the wavesolder heat flow blocked, the BGA landing areas and BGA components experience much less heat deformation, and a much lower solder joint defect rate is achieved. Selection of silk screen, solder mask or KAPTON tape is based on a balance of solder process conditions and effective insulation capability, with the lowest cost, most effective solution preferred.

7 Claims, 9 Drawing Sheets

MASKING OF CIRCUIT BOARD VIAS TO REDUCE HEAT-INDUCED BOARD AND CHIP CARRIER PACKAGE WARP DURING WAVESOLDER PROCESS

BACKGROUND OF THE INVENTION

1. Field of the Invention

This invention relates to the masking of vias in circuit patterns or circuit boards, and is particularly concerned with techniques for covering vias with insulating material so as to reduce or eliminate heat-induced printed circuit board or chip carrier package warp during the wavesolder process.

2. Description of the Related Art

The past decade has witnessed an explosion in demand for increasingly powerful electronic products with smaller and smaller packages. In response, manufacturers have incorporated high density component assemblies into their products; but limits were soon reached as to improvements in product cost, packaging density, circuit performance, and reliability in using conventional through hole packaged component assembly technology. Therefore, manufacturers invoked a trend towards the use of surface mount devices in their designs in the mid-1980's.

Surface mountable devices do not require component mounting or lead holes for board affixation, and their packaging size is relatively smaller than that of their pin-through cousins. With this technology, manufacturers are able to reduce overall circuit board assembly size through increased placement densities, finer pitch component terminals, and dual-sided component mounting. Further, the use of smaller mass surface mount technology (SMT) components increases vibration and shock resistance. Also, smaller component sizes and increased placement density mean shorter distances for signals to travel, thereby improving high speed, high frequency circuit performance.

More recently, component manufacturers have introduced a type of surface-mountable component chip package, known as ball grid array or BGA, which discards the use of external leads in integrated circuit chip packaging altogether. Connections between the BGA device and the circuit board are made through contact pads placed on the underside of the chip. Visually, the arrangement of contact pads appears as a two-dimensional grid or matrix of small solder blobs or balls extending from the underside of the chip, hence the name Ball Grid Array. A complementary contact pad array or landing area is located on a surface of the circuit board where the BGA device is to be positioned. Since no leads extend from the BGA package, its effective footprint is appreciably smaller than that of comparable dual or quad flat package SMT designs.

Since typically the BGA footprint is so compact and its pin count and density are so high, surface circuit traces cannot be used to connect to the interior contact pads of the BGA landing areas. Instead, contact pad access is achieved by connecting each contact pad to an adjacent through via. The vias, in turn, are connected to circuitry patterns on the other board layers so as to complete electrical integration of the BGA components. Thus, board designers will put a significant number of through vias within the BGA landing areas and directly underneath BGA components.

Because of its inherent size advantage, electronics manufacturers are motivated to incorporate BGA-packaged devices into their space and volume sensitive designs. However, a number of manufacturing defects have been observed in boards populated with BGA components. The BGA component and other top surface mounted components are installed on the circuit board using conventional techniques. Next, bottom side components are applied and the circuit board undergoes a wavesoldering process to affix the bottom side components and to solder any through hole components. The defective circuit boards exhibit pin-cracking defects or solder joint fractures at contact pads within the BGA landing areas after undergoing the wavesolder processing. The defects disrupt circuit continuity and can lead to board failure. Furthermore, the defect rate appears to be dependent on the physical location of the BGA devices with respect to any printed circuit board stiffeners affixed during wavesoldering.

These defects add significant rework and repair costs, and present a quality control problem that few manufacturers would risk. Serious modification to or employing alternatives to conventional wavesolder processing would involve extensive retrofitting of existing board assembly production facilities, not to mention possible board redesign, with no guarantee that it would eliminate the problem, or at least, make BGA a cost effective design choice. Therefore, in order for electronics manufacturers to reap the space-saving benefits of BGA technology, it is desirable to rectify the wavesolder manufacturing defects without significant line retooling or costly board redesign.

SUMMARY OF THE PRESENT INVENTION

Research has shown that the pin cracking and solder joint fractures defects are at least partially attributable to heat-induced circuit board and/or chip carrier warp. The warp has been traced to conductive heat transfer occurring at the uninsulated through vias. During wavesolder, heat energy flows from the exposed board face to the circuit patterns on the other board surface by way of the conductive plating of the through vias. The heat flow increases temperatures along the circuit traces connected to these vias and ultimately at the component contact areas, including the component to contact pad solder joints.

As the BGA landing areas possess a high concentration of through vias positioned directly underneath the BGA components and electrically connected thereto, they are especially vulnerable to conductive heating. In these areas, the buildup of transferred heat energy is high enough to cause uneven thermal expansion of the BGA chip packages in relation to the circuit board. In response, the board or BGA components may buckle or deform to accommodate the uneven expansion, thereby producing the aforementioned solder joint cracks or fractures.

It has been further ascertained that board stiffeners may compound the warp problem by altering and localizing the natural flex of the circuit board, making certain areas more susceptible to heat deformity than others. If BGA devices are to be physically located in such a board area, the chances for defects are increased. Conversely, BGA devices placed in a relatively rigid area of the board experience less warp, and consequently less of these defects. Though defects could be partially managed by careful BGA chip placement in relation to board stiffeners, the defects would still persist at an unacceptable level, because significant numbers of vias must remain underneath the BGA components. Further, this location restriction could limit placement of the BGA chip to areas of reduced electrical desirability, thus compromising actual board operations and performance, or could cause greatly increased difficulties in routing circuit traces. Further still, the BGA landing areas are inherently more flexible than other board regions because the high via density reduces the localized stability of the board, and still would be susceptible to some degree of heat deformation, regardless of component location.

The method for reducing or eliminating heat-induced chip/board warp according to the invention involves combining variable degrees of wavesolder process control with a means to shield the chipside solder joints from the heat source.

Careful process control according to the invention involves regulation of certain critical parameters of the wavesolder process, including solder pot temperature, circuit board assembly speed, wave contact time and wave contact width. Experimentation has revealed that the degree of process control required to satisfactorily reduce defects depends on the type of shielding employed and the particular board design involved.

The shielding means of the present invention will preferably include an insulating material applied in a manner that covers or masks non-chipside apertures of the vias located within the BGA landing areas of the circuit board to minimize conductive heating. Several alternatives are available to be used depending on the functions mentioned, with the alternatives generally having a proportional relationship between effectiveness and cost.

In one of the least expensive alternatives, solder mask material is applied to the vias before the board undergoes hot air solder leveling (HASL) processing. With a moderate amount of wavesolder process control, solder mask material performs well as a conductive heat insulator. Because solder-masking is normally applied to the board prior to HASL processing this alternative requires no additional processing steps, and the extra masking material is essentially cost-free. However, some degree of wavesolder process control may be required, and there remains a possibility that typically corrosive solder mask material or solder flux may become trapped in the masked via apertures. Also, because pre-HASL masking promotes incomplete through via formation within the masked region(s), this alternative may require the rerouting of some PCB circuit traces.

An equally inexpensive means to insulate the vias is to apply silk screen ink in a solid layer over the through vias. As silk screen ink is normally applied after HASL processing, silk screening the vias requires no additional application steps or apparatus with no corrosivity or circuit trace routing problems. However, of these alternatives, silk screen is the poorest insulator and most process-sensitive material, so it may not be suitable for some board designs or manufacturing lines.

A third alternative is to cover the through vias with solder mask after the HASL step, which reduces the possibility of trapping corrosive agents in the via channel while delivering thermal performance equal to that of pre-HASL solder masking. Likewise, post-HASL masking does not affect through via formation, thereby eliminating the need to reroute circuit traces. However, post-HASL solder masking requires an additional application step, which increases manufacturing cost.

A fourth alternative places a layer of KAPTON™ (a trademark of DuPont) tape over the through vias. This is the most effective and most process insensitive, but is also most expensive, requiring additional materials and additional process steps.

The invention is simple, but is an effective technique to significantly reduce or eliminate heat-induced warp, and ultimately reduce solder joint defects at the BGA landing areas. It permits manufacturers to incorporate BGA technology into their designs and use conventional wavesolder techniques without undue quality control problems. Further, the invention reduces defects without placing special limits on BGA component placement or landing area layout. Finally, the insulating material, as illustrated in the foregoing embodiments, could include materials already applied to the circuit board for other uses, thereby possibly eliminating costly extra application steps and apparatus from the board assembly line.

BRIEF DESCRIPTION OF THE DRAWINGS

A better understanding of the present invention may be obtained when the detailed description of the preferred embodiments are considered in conjunction with the following drawings, in which.

DETAILED DESCRIPTION OF PREFERRED EMBODIMENTS

Figure 1:
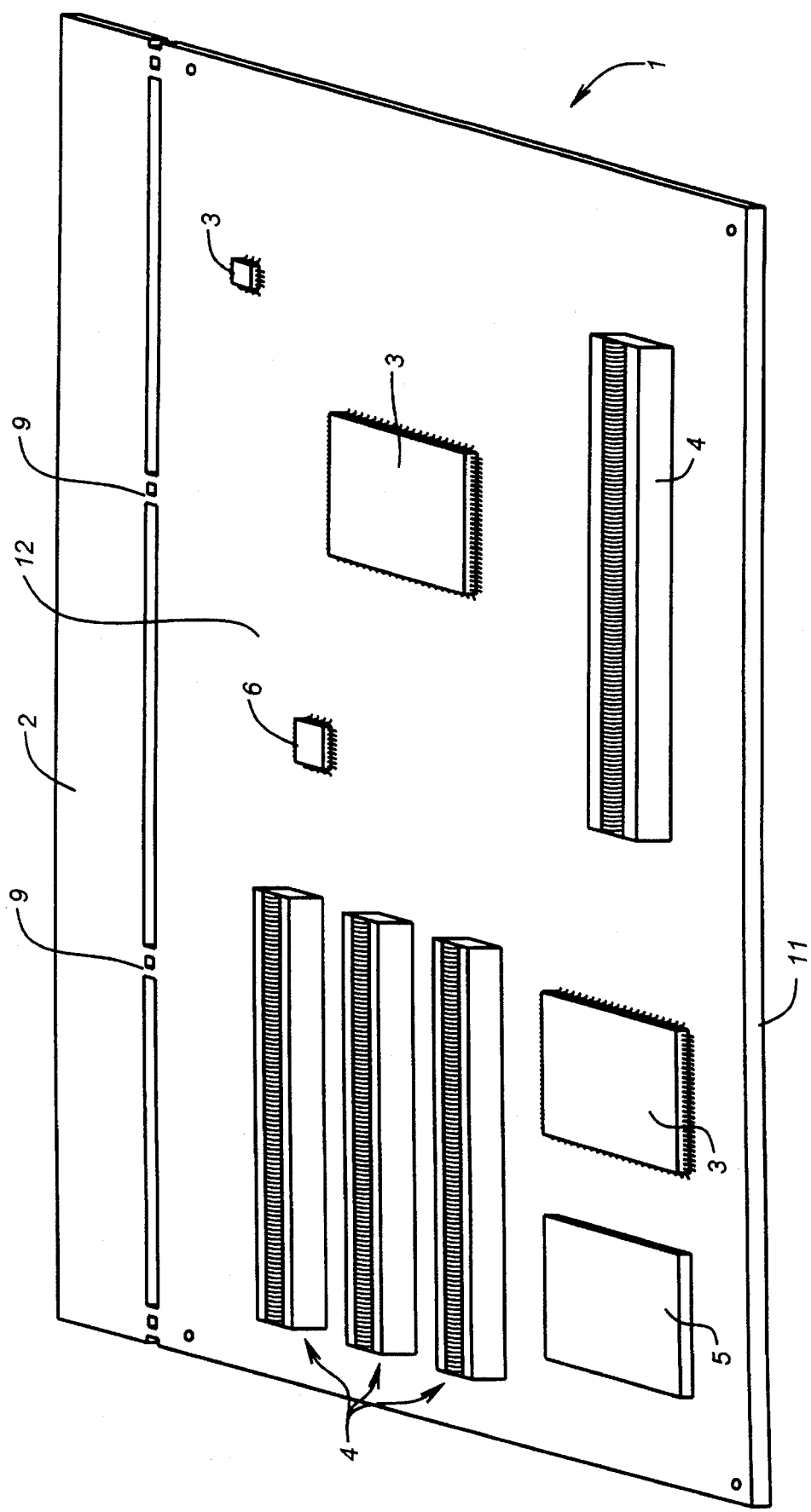
FIG. 1 is a top perspective view of a simplified circuit board assembly according to the present invention.

Referring now to FIG. 1, a top perspective view of a simplified circuit board assembly, including printed circuit board (PCB) 1, is shown in which the present invention may be practiced. The PCB includes at least two surfaces, a top layer 12 and a bottom layer 13 (FIG. 2), both preferably suitable for mounting a plurality of electrical components separated by one or more internal layers. Each of the layers are preferably made of copper on epoxy glass such as FR-4, although other types of dielectric materials, such as polyamide glass/copper, cyanate ester glass/copper, Aramid/copper, PTFE/copper and ceramic/copper, may be used as known to those skilled in the art of fabricating multilayer PCBs. PCB 1 is preferably rectangular in shape including an edge 11, although the present invention is not limited to any particular geometric shape of PCBs.

Figure 2:
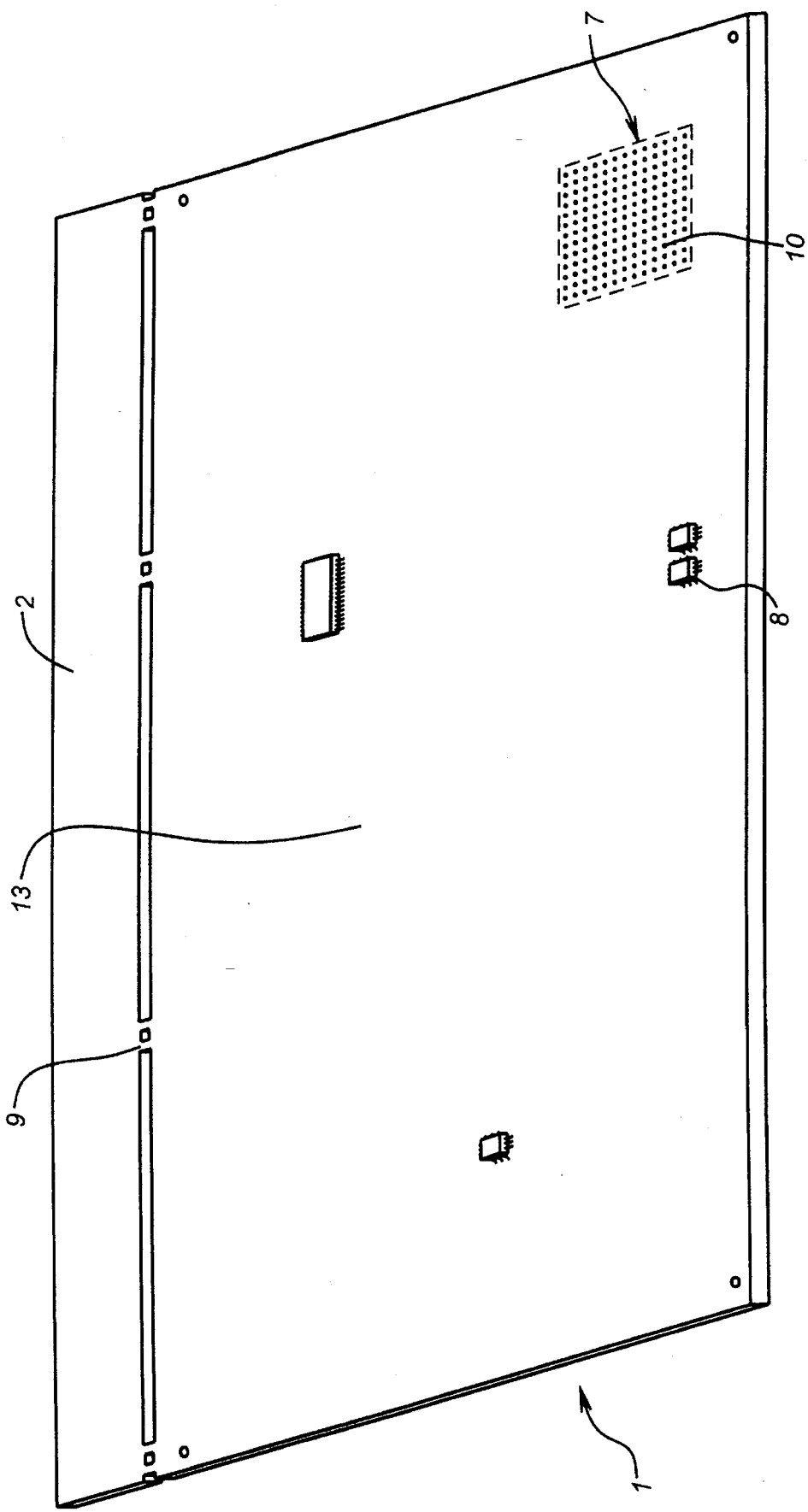
FIG. 2 is a bottom perspective view of the circuit board assembly shown in FIG. 1, prior to insulative masking.
Figure 3:
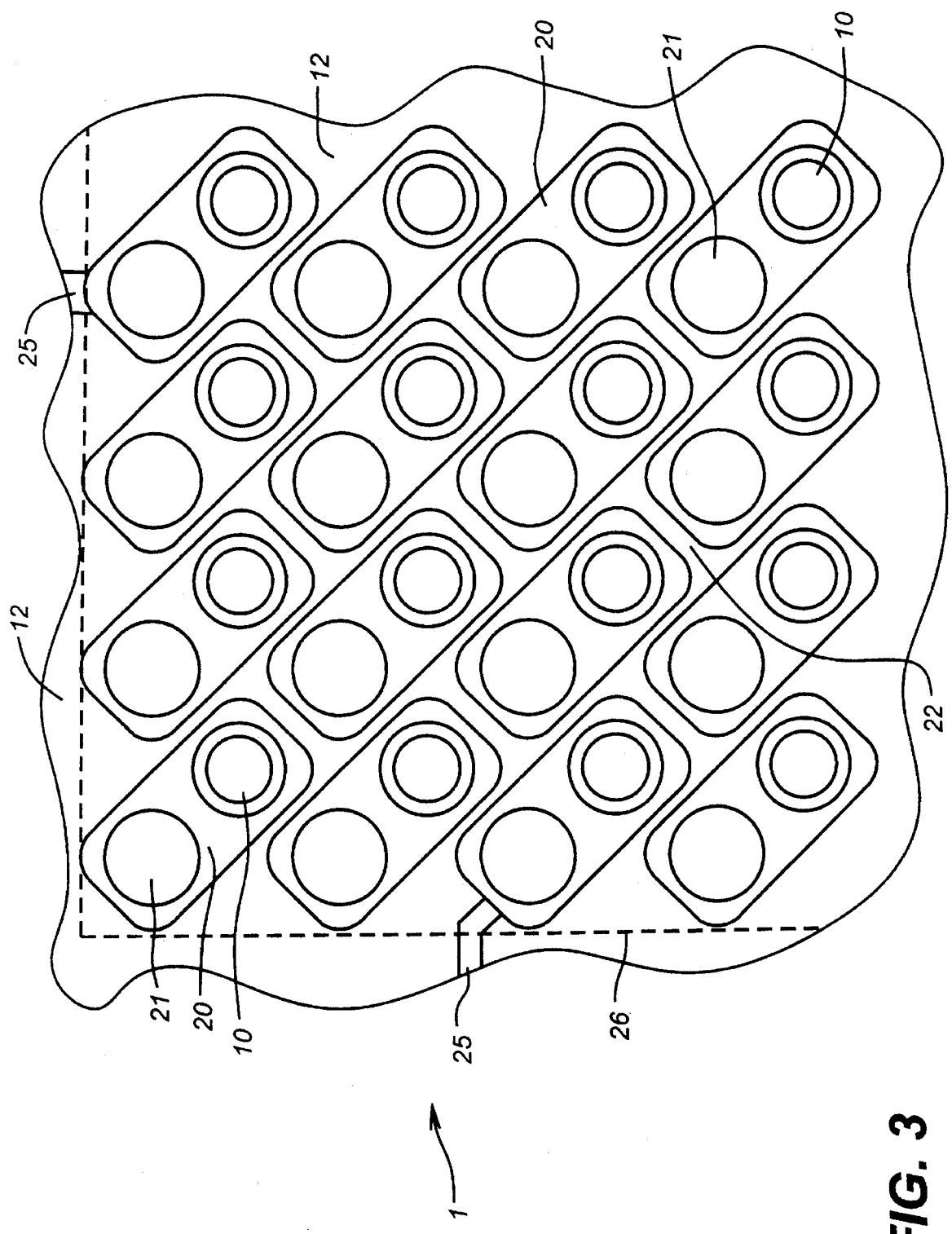
FIG. 3 is an expanded top view of a portion of a BGA landing area, prior to component affixation.

A ball grid array (BGA) packaged integrated circuit 5 is shown mounted on PCB 1 at the BGA landing area 22 (FIG. 3). A single, rectangularly-shaped BGA component 5 is shown, but it will be understood to those persons skilled in the PCB manufacturing art that the present invention may be practiced for any shape or size of BGA component or any number of mounted BGA components. The BGA component is attached to the board surface through a plurality of landing area contact pads 21 (FIG. 3) aligned with the solder ball matrix located on the underside of the BGA chip. A plurality of other electrical components, including quad plastic flat packaged integrated circuits 3, surface mount dual inline packaged integrated circuits 6, card edge connector receptacles 4 and various discrete components 8 (FIG. 2) are shown mounted on the top and bottom layers of PCB 1 for the purpose of illustration.

Through vias 10 (FIG. 2) establish electrical connections between circuit patterns residing within the different board layers. These vias are typically formed by drilling holes through all layers of PCB 1 and coating their edges with a conductive material. The conductive material used is preferably solder, although other conductors may be used as generally known by those skilled in the art of PCB manufacturing.

Conductive signal traces 25 (FIG. 3) are routed on the internal and external layers of the PCB 1 to electrically connect the inputs and outputs of the electrical components mounted on the PCB surface layers, thereby forming the aforementioned circuit patterns. Conductive traces 25 are preferably formed of copper, although other conductive materials may be used.

FIG. 1 also shows a PCB stiffener 2 attached to the board edge by means of couplings 9. The stiffener and couplings are preferably made from the same dielectric material as is used to fabricate the PCB 1, but other materials known by those skilled in the PCB manufacturing art may be substituted. As the PCB stiffener 2 is attached in part to alter the natural flex of the PCB 1, it can affect the degree of board warp experienced in the BGA landing areas and ultimately the solder joint defect rate for BGA components in uninsulated conditions. However, experimentation has revealed that the insulative masking techniques according to the present invention are effective at minimizing solder joint defects within the BGA landing areas even when PCB stiffeners are present, so they are not of direct relevance to practicing the present invention.

Figure 4:
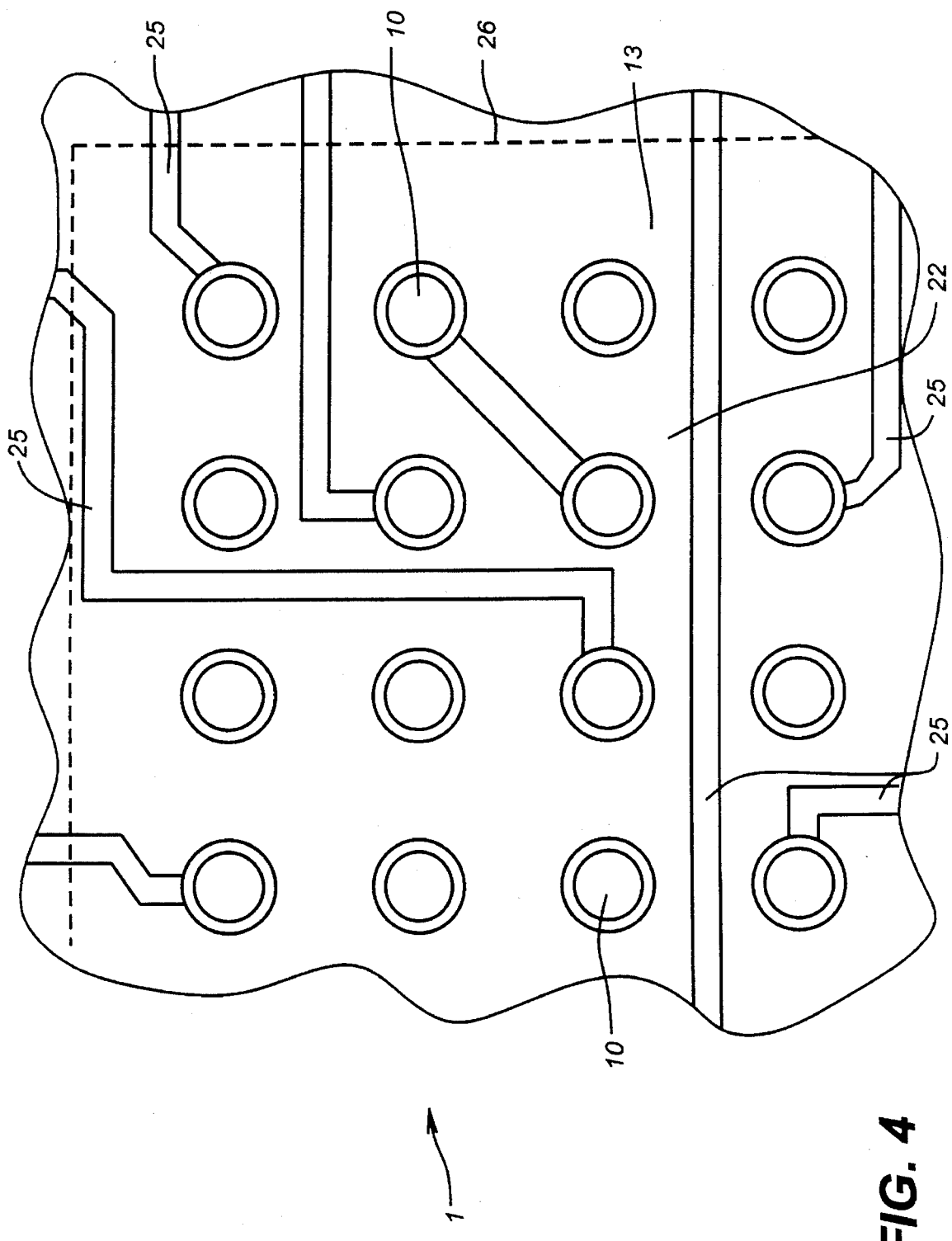
FIG. 4 is the bottom view of the portion of the BGA landing area shown in FIG. 3, prior to insulative masking.

FIG. 2 is a bottom perspective view of a simplified diagram of the circuit board assembly shown in FIG. 1, prior to the application of insulative masking according to the invention. Board region 7 lies directly beneath the BGA device, and dashed box indicates the BGA landing area periphery 26 (FIG. 4). The plurality of through vias 10 placed within the BGA landing area is also indicated.

FIG. 3 is an expanded diagram of a BGA landing area 22 corner section residing on the top layer 12 immediately beneath BGA component 5 as shown in FIG. 1. This view illustrates the section appearance prior to chip affixation. The BGA landing area 22 is comprised of tinned contact pads 21, through vias 10, conductive pad to via connecting plates 20 and conductive circuit traces 25. The conductive connecting plates 20 are preferably made from the same material as the conductive circuit traces 25, though any conductive material known to those skilled in the PCB manufacturing art may be substituted. The periphery 26 of the BGA landing area 22 is defined by dashed lines.

As the name suggests, the contact pads 21 will be used to form the connection between the PCB circuit patterns and the solder ball grid of a BGA component. In this embodiment, the contact pads are circular, but the actual shape is not of relevance.

Through vias 10 are plated through holes with a constant diameter throughout the layers of PCB 1, used as an electrical through connection between circuit patterns found on the surface and in the internal board layers. Normally, no component leads or reinforcing material are placed within these vias. The diameter of the vias 10 is preferably within a range of 12 to 18 mils.

FIG. 3 also shows the relationship between the contact pads 21 and the through vias 10. Due to the high pin density and high pin count of BGA devices commonly encountered in the electronics manufacturing arts, the contact pad spacing within the BGA landing area will normally not permit conductive circuit traces 25 from being placed in between the connecting plates 20. Therefore, except for a few pads located at the periphery of the BGA landing area, the contact pads 21 are connected only to vias 10. The vias 10 distribute BGA component pin connections across the other board layer or layers to allow full electrical access within the minimum surface area. Conductive circuit traces 25 are shown being only be routed to those contact pads 21 or connecting plates 20 located on the landing area periphery.

FIG. 4 is a bottom view diagram of the BGA landing area section shown in FIG. 3, prior to the application of insulative material according to the present invention. Several circuit traces 25 are connected to a plurality of vias 10 at their plated edges.

Figure 5:
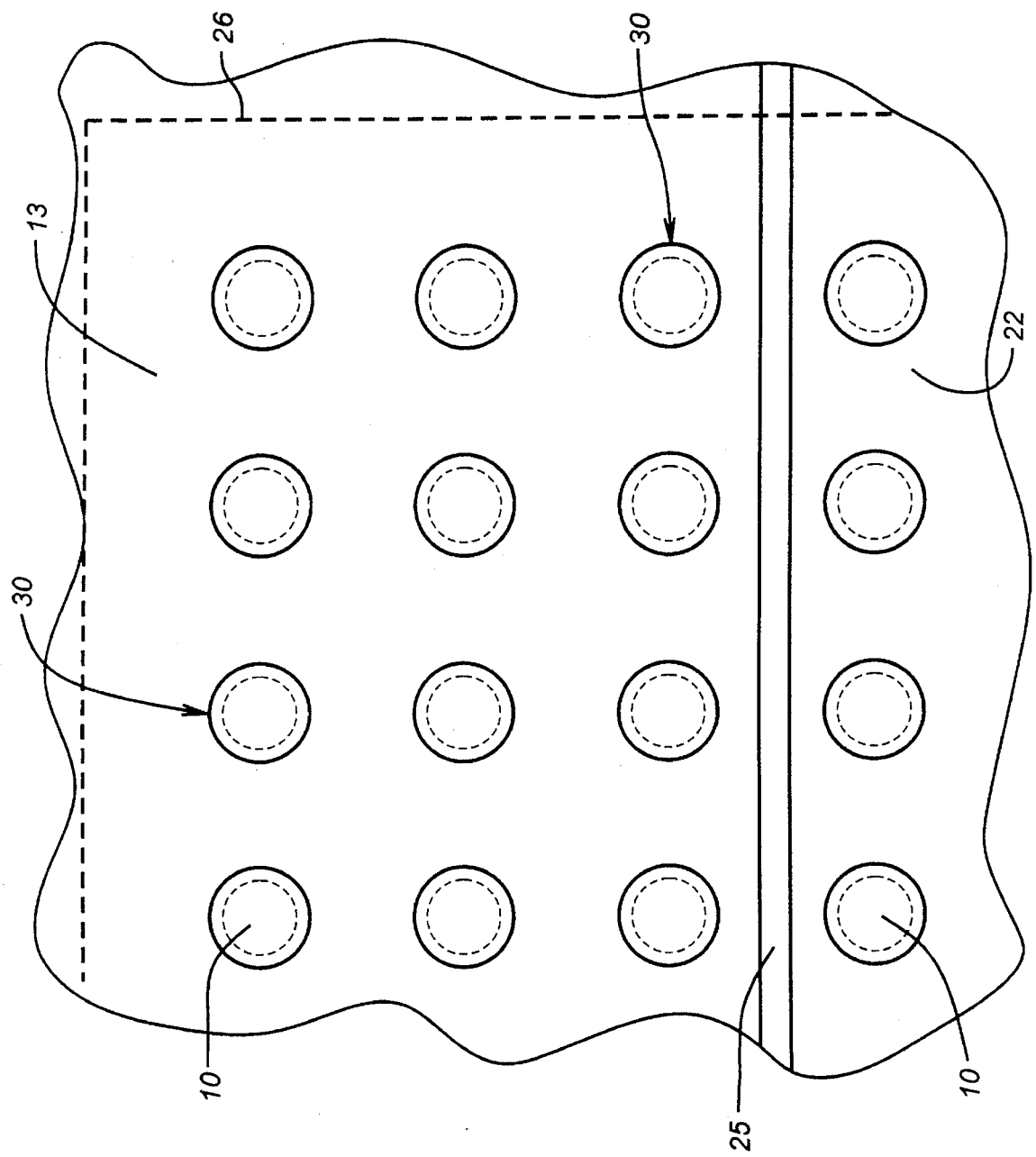
FIG. 5 is the bottom view of FIG. 4, illustrating pre-HASL solder masking and bottomside surface circuit trace rerouting.

FIG. 5 is a bottom plan view of the PCB section shown in FIG. 4 after the application of an insulative material according to the invention. In this embodiment, solder mask material 30, as commonly known in the board manufacturing industry, is applied in a manner that completely covers both the via apertures and circumferential edges. In this embodiment, the solder mask is deposited in a shape roughly approximating the outline of the via aperture, although the shape chosen is not of relevance as long as a heat resistant insulative barrier of solder mask material is formed over the vias positioned in the BGA landing areas. The solder mask barrier will block conductive heat flow through the vias and lower top layer 12 surface solder joint temperatures within the BGA landing areas when the bottom layer 13 is directly exposed to wave solder pot contact. This operates to reduce or eliminate solder joint defect rates for BGA populated PCBs.

Figure 8:
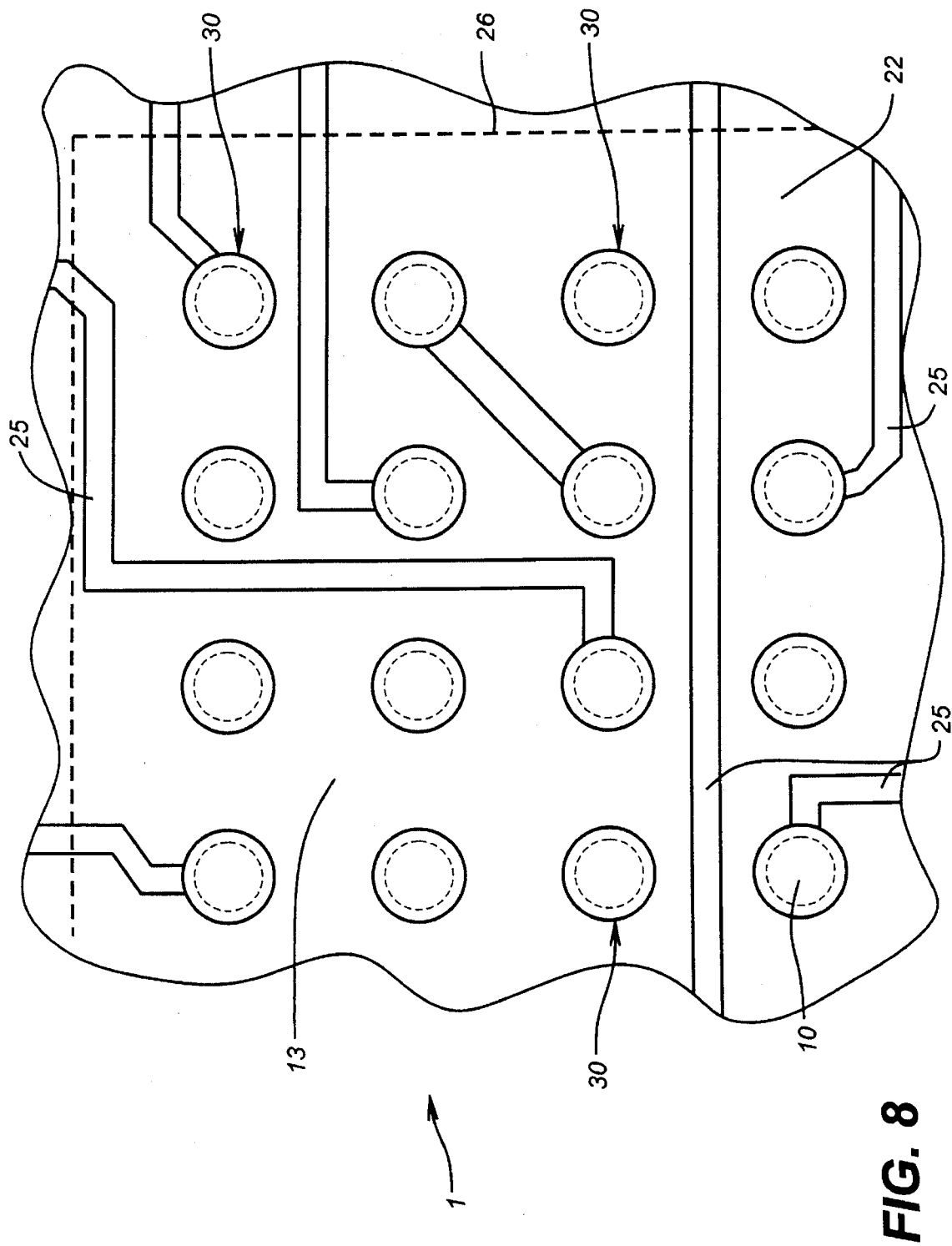
FIG. 8 is the bottom view of FIG. 4, illustrating post-HASL solder masking.

However, it is preferable when using solder mask material as an insulating medium according to the present embodiment that its use be at minimum because solder mask can interfere with electrical test access and prevent proper solder flow during the tinning and HASL steps. Conventional solder masking techniques, known to those skilled in the PCB manufacturing art, may be used to cover the vias as shown in FIGS. 5 or 8.

In the embodiment of FIG. 5, the solder mask is applied to the vias before the PCB undergoes the tinning and hot air solder leveling (HASL) process steps, and will be referred to as pre-HASL solder masking. In contrast, solder mask application which is done after HASL processing (FIG. 8) will be termed post-HASL solder masking. Preferably, pre-HASL masking according to the present embodiment is performed at the same time the remainder of the solder mask is applied (before the PCB is tinned) so that no extra application step is required.

Of the three insulative materials investigated, silk screen 24 (FIGS. 6 and 7); solder mask 30 (FIGS. 5 and 8) and KAPTON taping 40 (FIG. 9), KAPTON tape ranks as most effective in reducing topside solder joint temperatures, followed by solder mask, and finally silk screen. Therefore, of the five alternative embodiments herein described, those utilizing silk screen as an insulating material must be exposed to relatively the least amount of heat to effectively minimize solder joint defects. Solder masking, whether pre-HASL or post-HASL, has demonstrated to be a more effective insulator than silk screen, but it too requires a cooler than normal thermal wave profile to minimize solder joint defects. KAPTON tape generally allows the use of a normal thermal wave profile, but has other concerns as discussed below.

The most effective means to lessen conductive heating involves increasing the velocity of the conveyor belt which carries the PCB assemblies through the wavesolder oven beyond normal rates. A higher velocity means less time that the PCBs are exposed to the high temperatures found within the wavesolder oven. The next most effective means to lower PCB exposure to conductive heating includes minimizing the wave contact width with the PCB assemblies as they are passed through the wavesolder oven. Increasing the conveyor speed and decreasing the contact width can be used together to minimize PCB exposure to the wavesolder temperature effects. Also maintaining the solder pot temperature at a lower temperature than normal can contribute to a cooler wave profile.

However, when the conveyor belt speed increases and the contact width decreases beyond certain board-dependent threshold levels, so does the chance that the exposed board face will experience solderability problems stemming from insufficient wavesolder contact time. Therefore, a balance must be found between increasing conveyor belt speeds and reducing surface contact exposure to insure acceptable performance from silk screen, solder masking or other insulation alternatives while preventing solderability defects resulting from a too cool of a wave profile. Research has indicated that this balance differs based on board design and insulation material utilized, and, in some cases, the balance is either unobtainable or so fragile that silk screening is not a practical option.

Since conventional solder mask material is a more efficient thermal insulator than silk screen ink, solder masking according to the invention offers greater flexibility in obtaining an optimal wave solder process control. Solder mask allows for relatively higher wave solder temperatures and board contact times than can be tolerated when silk screen is the insulating medium. The degree of process modification to conventional wavesolder techniques is not as severe, and the conveyor line can be run at a slower speed than what silk screen requires. Further, when pre-HASL solder masking techniques are utilized, the vias can be insulated at the same time solder mask is already being applied to the PCB for directing solder flow during subsequent processing steps. This saves an extra application step, and since conventional solder mask material has a negligible materials cost, pre-HASL solder masking according to this embodiment imparts no additional manufacturing cost.

However, there is a possibility that pre-HASL solder masking may introduce new defects into the circuit assembly process. Because pre-HASL solder masking occurs before the PCB is tinned and the vias are plated, during the tinning process liquid solder collects inside the via channel above the solder masking insulative barrier. As the liquid solder cools, these vias may possibly trap typically corrosive solder flux inside the via channel near the closed ends which may degrade the vias or surrounding PCB structures.

Further, because the pre-HASL masking obstructs liquid solder flow within masked via channels, the solder may not flow to contact and plate the circumferential edges of the bottomside masked via apertures, thereby preventing the formation of a reliable conductive pathway between the bottom and top surface layers. As there is no guarantee that these circumferential edges are electrically connected to the other board layers, board designers are foreclosed from using bottom surface circuit traces to tap the masked vias.

FIG. 5 illustrates bottom layer circuit trace rerouting which may be necessary in this embodiment, and is particularly noted by the absence of bottom surface circuit traces 25 connected to masked vias 10 which are shown in FIG. 4.

Research has shown, however, that the amount of corrosive material that may be trapped in a masked via is negligible and has not become a true product quality concern. Likewise, the pre-HASL masking has been found only to hinder solder flow from the via channel to the masked circumferential edge, so the bottomside connecting circuit traces can be rerouted to internal layers to complete BGA component integration. In fact, for most board designs, the problems associated with utilizing nominal cost pre-HASL masking are quite acceptable in light of the number of solder joint defects reduced. Thus, if a particular PCB design is such that pre-HASL solder masking can be employed without otherwise compromising board manufacturing, it is the most preferred embodiment.

Figure 6:
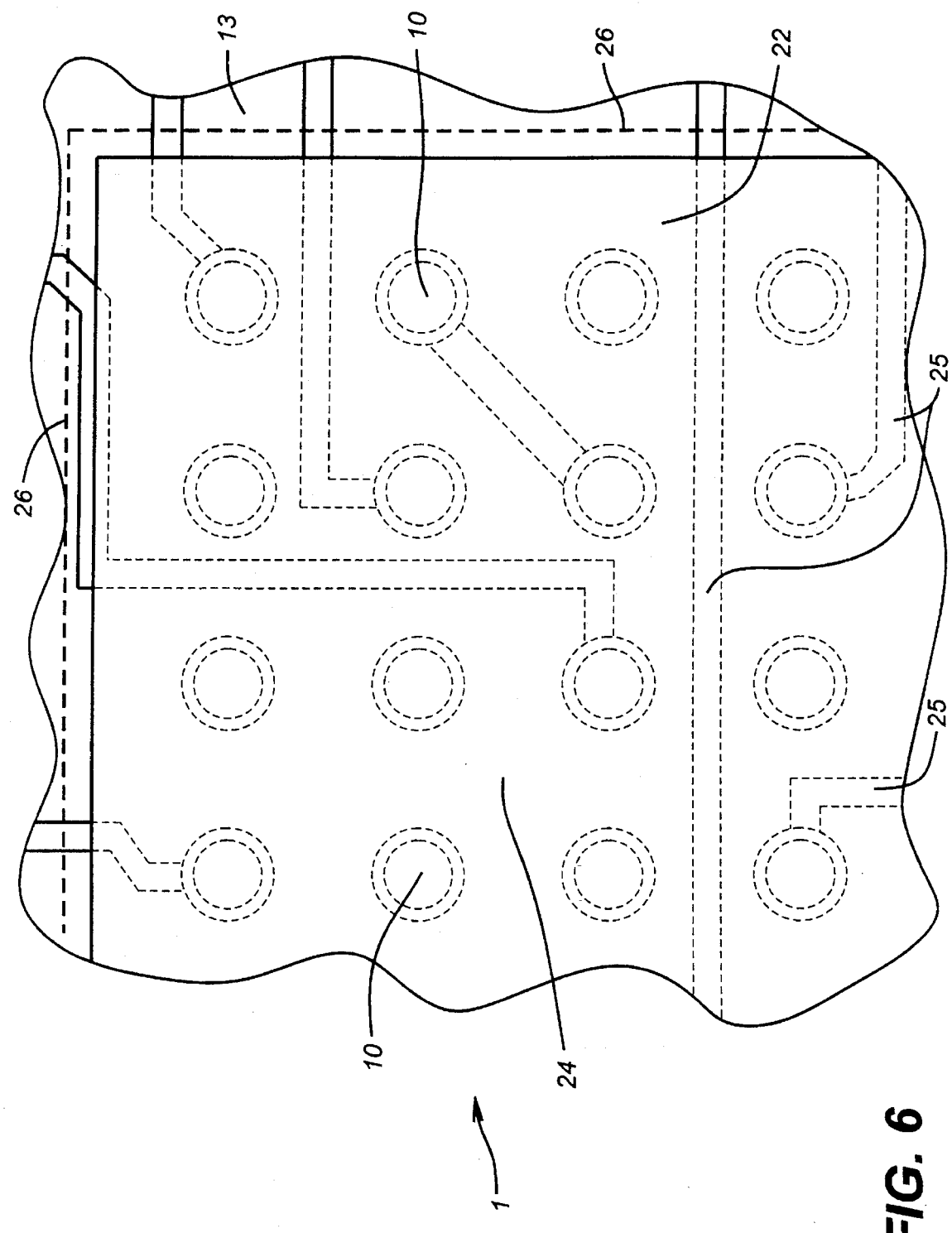
FIG. 6 is the bottom view of FIG. 4, illustrating silk screen masking.

FIG. 6 is a bottom plan view of the PCB section shown in FIG. 4 after the application of an alternative insulative material according to the invention. In this embodiment, silk screen material 24, as commonly known in the board manufacturing industry, is deposited in a pattern roughly approximating the entire BGA landing area. The exact size or shape of the deposited silk screen pattern is not critical as long as it is sufficient to completely cover all the vias 10 contained within the BGA landing area so that an insulative barrier is formed to reduce or eliminate conductive heat transfer at the vias.

Standard silk screen deposit techniques can be employed to apply the silk screen material to the areas of the board shown in FIG. 6.

As discussed above, silk screen is not as effective as a thermal insulator as either solder mask or KAPTON tape, and consequently, requires a greater amount of wavesolder process control to be as effective in reducing solder joint defects. In fact, for some board designs or manufacturing lines, the wave solder process cannot be modified enough to permit the use of silk screen as an insulating medium without introducing new problems (e.g., insufficient bottom side component solderability) into the manufacturing process. Only through experimentation using variable conveyor belt speeds, contact widths and solder pot temperatures can it be ascertained whether silk screen will be an effective conductive heat insulator for a particular board.

Silk screen does offer some advantages over the other investigated materials. As silk screen is normally applied to circuit boards, it too requires no extra application step or apparatus, and there is no practical cost increase in the extra silk screen material used to mask the vias. It may be applied in a manner that minimally impacts electrical test access (e.g., FIG. 7). And, unlike pre-HASL solder masking, benign silk screen material is applied after the tinning and HASL steps, thus eliminating any trapped flux concerns.

Because of its inferior thermal characteristics, silk screening the vias is less desirable than pre-HASL solder masking. It is, nevertheless, the most preferred embodiment when pre-HASL masking is not an option, if for example trapped flux or bottomside trace-rerouting is a concern.

Figure 7:
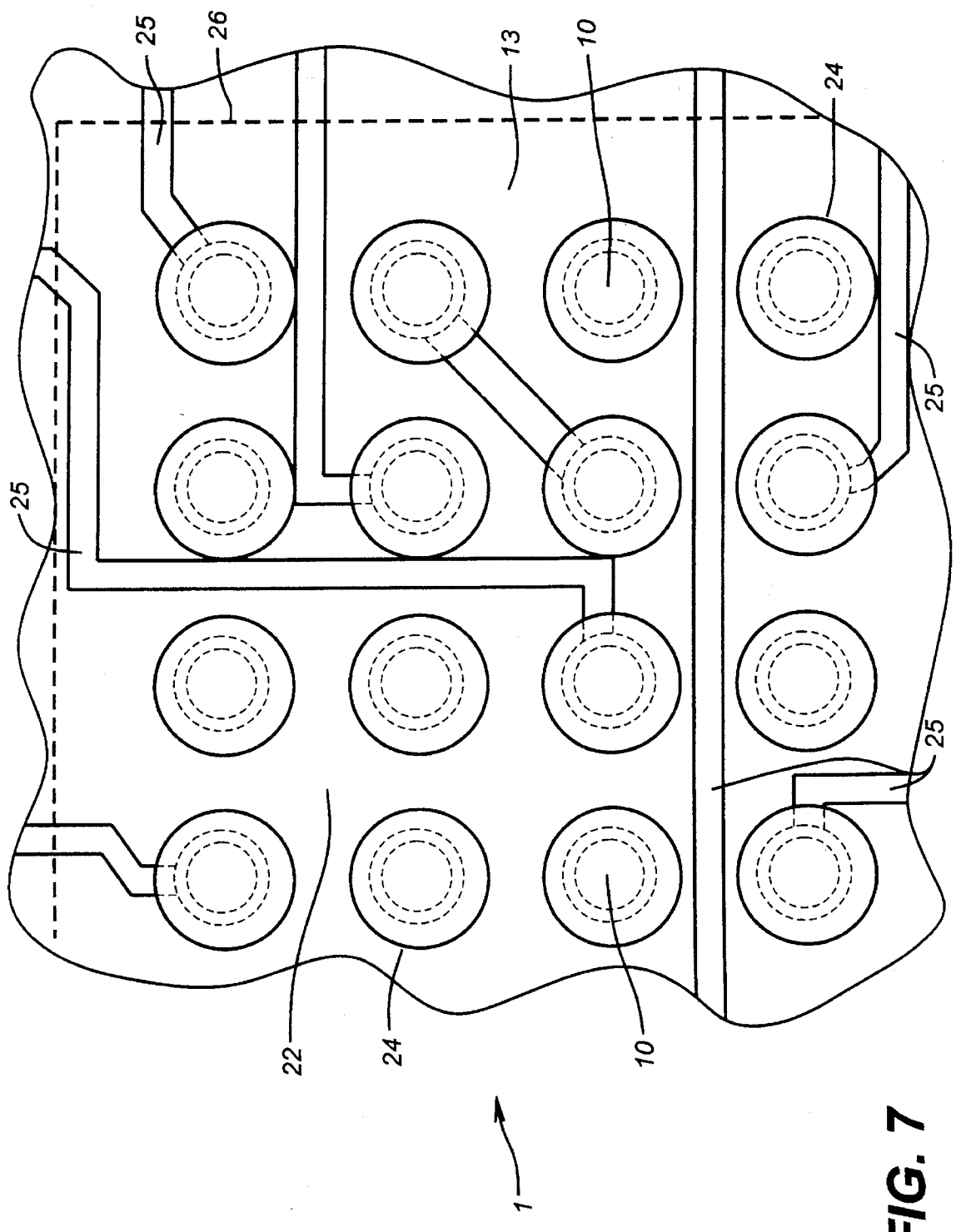
FIG. 7 is the bottom view of FIG. 4, illustrating silk screen masking.

FIG. 7 illustrates an alternative embodiment of FIG. 6 in which the use of silk screening material as an insulating medium is kept to a minimum.

FIG. 8 illustrates an alternative embodiment of FIG. 5 in which solder mask material is applied after HASL processing. In either instance, the via apertures and circumferential edges are completely covered by solder mask material to reduce conductive heat flow to the BGA landing area solder joints.

As post-HASL solder masking, by definition, is performed after the tinning and HASL steps in which the vias are plated through, there is no masking in place during the tinning step to obstruct solder flow or create flux trapping solder build-up in the via channel. Therefore, the pre-HASL potential reliability concern and trace-routing limitations are averted. Also, post-HASL masking according to the present embodiment offers thermal performance superior to that of silk screen masking and roughly equal to that of pre-HASL masking at no additional materials cost. However, post-HASL solder masking requires an additional application step not needed in pre-HASL solder or silk screen masking. This additional application step translates into increased PCB fabrication cost not incurred when either pre-HASL solder masking or silk screening is used. Accordingly, post-HASL solder masking is less desirable than pre-HASL solder masking or silk screening, but is considered most preferable if neither of these options are available.

Figure 9:
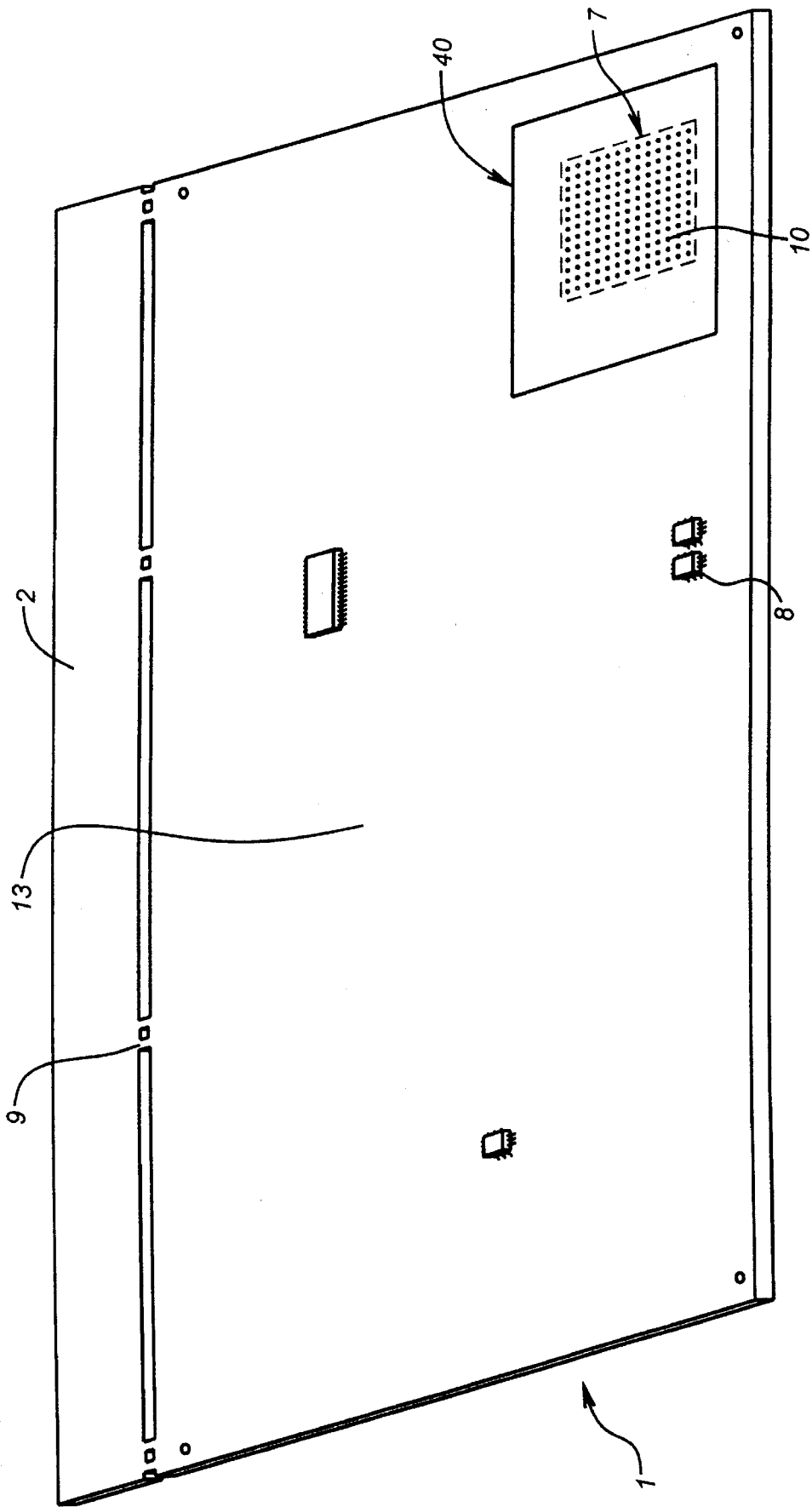
FIG. 9 is a perspective view of the circuit board assembly diagram shown in FIG. 2 illustrating KAPTON tape insulation application.

FIG. 9 is a bottom perspective view of the circuit board shown in FIG. 2, illustrating KAPTON™ (a trademark of DuPont) tape masking according to the present invention. In this embodiment, a KAPTON tape strip 11 is applied over the BGA board region 7, covering all vias within the BGA landing area. In this embodiment the KAPTON tape strip is rectangular in shape, but the exact size or shape of the KAPTON tape is not relevant as long as all vias within the BGA landing area are covered. It is preferable, however, because of adjacent component solderability issues, electrical test access and material cost considerations that the amount of KAPTON tape used be at a minimum.

It will be understood by those skilled in the art of PCB manufacturing that other organic polymer compositions that have low thermal conductivity (i.e. about 0.15 W/m.K) can be substituted for KAPTON tape in this embodiment. Preferably, the organic composition selected, or adhesive or tape of the composition, does not leave an interfering residue on the contact pads, test access pads or via edges of the PCB when it is removed.

The KAPTON taping can be applied manually or by machine in an extra step in the manufacturing process. Preferably, the KAPTON tape will be removed after the wavesolder step as an additional manufacturing step.

Research has indicated that KAPTON taping proves the best insulation of the three investigated insulating materials. When KAPTON taping is used, extensive wavesolder process monitoring or modification is not required, and in some cases, process modification is not necessary to prevent pin cracking or solder joint fractures within the BGA landing area. However, KAPTON taping itself adds a material cost and the additional application and removal steps result in additional assembly costs. Therefore, while the KAPTON tape is the best insulator, it is the least preferred of the three alternatives and is preferred only when the aforementioned silk screen and solder mask techniques are not effective.

Assembly of a completed circuit board according to the present invention then proceeds as follows. First, the actual circuit board is constructed. If silk screen material or solder mask are to be used as the insulating material, these are applied at the appropriate step in the construction process. Following this, top side components, including the BGA components, are installed and soldered using conventional techniques. The bottom side surface mount and through hole components are then installed. If KAPTON tape is being utilized, it is installed on the bottom side in the location described above, and may be applied immediately before, concurrent with, or immediately after bottom side component installation.

After both board surfaces are populated, the bottom side is wavesoldered. The actual wavesolder process parameters are set according to the guidelines discussed above and insulating material being used. The insulating material limits heat conduction during the wavesoldering process to limit pin cracking and solder joint fractures. Final testing and assembly of the circuit board then proceeds after the wavesoldering step.

The above described embodiments illustrate the technique according to the present invention which may be used to rectify heat-induced solder joint defects in the BGA landing areas occurring when wavesoldering PCB assemblies. The technique calls for combining regulating the wavesolder process with covering the through vias with an insulative material. As illustrated in the above embodiments involving silk screen, solder mask and KAPTON tape as the selected insulating mediums, generally less process control is required as the thermal effectiveness of the chosen insulator increases, but at a cost tradeoff. Preferably, the insulating material chosen will provide adequate thermal protection at the least cost to the manufacturer.

This invention has been described in terms of particular embodiments. Obviously, modifications and alterations will be apparent to those skilled in the art in view of this disclosure, including, but not limited to, the particular mask pattern chosen, the particular type of insulating material used to cover or fill the vias and the thickness of insulative layer. It is therefore intended that all such equipments, variations, and modifications fall within the spirit and scope of the invention as claimed.

What is claimed is:

1. A method of manufacturing a circuit assembly, comprising the steps of:

constructing a printed circuit board, said circuit board comprising a stacked plurality of circuit patterns interposed by one or more insulating layers and a plurality of plated, open through vias interconnecting said circuit patterns, said printed circuit board having two opposed surfaces for receiving components, said circuit patterns and open through vias including circuit patterns and open through vias for receiving and connecting a ball grid array packaged component to a first surface of said printed circuit board, said ball grid array open through vias being located in a landing area defined by the border of said ball grid array packaged component;

covering said ball grid array open through vias with an insulating material applied on the second surface of said printed circuit board without filling the vias;

installing and soldering components, including a ball grid array packaged component, on said first surface of said printed circuit board;

installing any components on said second surface of said printed circuit board; and wavesoldering said second surface of said printed circuit board after installation of said components and covering said ball grid array open through vias.

2. The method of claim 1, wherein the step of covering said ball grid array open through vias with an insulating material comprises covering only said ball grid array open through vias.

3. The method of claim 1, wherein the step of covering said ball grid array open through vias with an insulating material comprises masking said ball grid array open through vias with a layer of silk screen material.

4. The method of claim 1, wherein the step of covering said ball grid array through vias with an insulating material comprises masking said ball grid array through vias with a layer of solder mask.

5. The method of claim 4, wherein said step of constructing a printed circuit board includes a step of hot air surface leveling and wherein said layer of solder mask is applied prior to said step of hot air surface leveling.

6. The method of claim 4, wherein said step of construct ing a printed circuit board includes a step of hot air surface leveling and wherein said layer of solder mask is applied after said step of hot air surface leveling.

7. The method of claim 1, wherein the step of covering said ball grid array open through vias with an insulating material comprises covering said ball grid array open through vias with KAPTON tape.

* * * * *